United States Patent [19]
Lindmayer et al.

[11] 3,982,964
[45] Sept. 28, 1976

[54] DOTTED CONTACT FINE GEOMETRY SOLAR CELL

[75] Inventors: Joseph Lindmayer, Bethesda; James Frederick Allison, Silver Spring, both of Md.

[73] Assignee: Communications Satellite Corporation (Comsat), Washington, D.C.

[22] Filed: Jan. 17, 1975

[21] Appl. No.: 541,827

[52] U.S. Cl. ............................................. 136/89
[51] Int. Cl.² ................... H01L 31/02; H01L 31/04
[58] Field of Search .................................... 136/89

[56] References Cited
UNITED STATES PATENTS
3,811,954  5/1974  Lindmayer ........................... 136/89

Primary Examiner—John H. Mack
Assistant Examiner—Aaron Weisstuch
Attorney, Agent, or Firm—Sughrue, Rothwell, Mion, Zinn and Macpeak

[57] ABSTRACT

An improvement in a fine geometry solar cell having a top surface contact comprising substantially more and finer metallic fingers spaced close together for collecting photo current is disclosed. The improvement comprises a reduction in the ohmic contact area of the fine metallic fingers with the light-incident surface of the solar cell. The improved solar cell is constructed by etching a fine line pattern into the anti-reflective coating of the solar cell and then depositing a fine line electrode onto the surface of the solar cell but oriented perpendicular to the etched fine line pattern in the anti-reflective coating. Due to the 90° rotation between the etched fine line pattern in the anti-reflective coating and the fine line electrode, only point contacts are made between the fine line electrode and the exposed light-incident surface of the solar cell.

10 Claims, 4 Drawing Figures

FINE GEOMETRY (60 LINES)

DOTTED CONTACT FINE GEOMETRY SOLAR CELL

BACKGROUND OF THE INVENTION

1. Field of the Invention

The present invention generally relates to solar cells, and more particularly, to an improved fine geometry solar cell wherein the contact area between the fine metallic fingers of the photo current collecting electrode and the light-incident surface of the solar cell are minimized.

Description of the Prior Art

The use of photovoltaic devices, commonly known as solar cells, which convert light energy to useful electrical energy is well known. Light entering these solar cells is absorbed, thereby generating Electron-hole pairs which are then spatially separated by the electric field produced by the solar cell junction and are collected at respective top and bottom surfaces of the solar cell. For example, in an n-p type solar cell electrons will travel to the top surface where they will then be collected by a metallic grid positioned thereon. The metallic grid may typically comprise a number of metallic fingers separated along the top surface by a relatively large distance and connected to each other by a common bus bar. The electrons will travel either directly to the metallic fingers or approach the top surface between the fingers and then travel along the surface of the solar cell until they can be collected by one of the fingers. Holes, on the other hand, will travel to the bottom surface of the solar cell where they may be collected by a metallic sheet covering the entire bottom surface.

A major improvement to solar cell design is described in U.S. Pat. No. 3,811,954 issued to Joseph Lindmayer and assigned to Communications Satellite Corporation. The improved solar cell described in the Lindmayer patent has the advantage of improving the efficiency of solar cells in the short wavelength, i.e., blue-violet portion of the spectrum corresponding to 0.3–0.5 microns thereby sharply increasing output power. This was accomplished basically by reducing the junction depth and providing a very fine geometric pattern metallic electrode on the light-incident surface of the solar cell. The junction depth is typically between 500 A to 2,000 A, and the metallic fingers of the fine geometric electrode are typically spaced on the order of only a few hundredths of a centimeter. The resultant fine geometric pattern electrode generally covers and is in ohmic contact with between 5 to 10% of the surface area of the solar cell and prevents the covered area from converting incident photons to electrical energy. The surface area which is not in contact with the electrode is covered by a metal oxide anti-reflective coating.

Reverse currents in silicon solar cells comprise the flow of electrons and holes to the junction where they recombine. This current degrades the performance of the cell, i.e. the I-V characteristic, by opposing a part of the primary current flow across the diode. Reverse currents which typically have been considered in solar cell models result from the bulk and space charge regions of semiconductors. Another source of reverse current is the top surface layer where impurities are centers of recombination as well as sources of thermally generated electron-hole pairs. However, this current is generally neglected in the standard solar cell since there is a high concentration of impurities which act to produce a minimum of electron-hole pairs that recombine at the junction. Furthermore, a thick "dead layer" isolates the surface generation centers in the top layer of the solar cell and also any effect from the ohmic contact with the metallic electrode. In the improved solar cell according to the Lindmayer patent, the shallow junction results in a minimization of the dead layer which exists at the light-incident surface of the normal silicon cell. Furthermore, the density of impurities diffused into the top layer of the cell is descreased and provides sources for a significant reverse current flow. The ohmic contact formed between the metallic electrode and the top layer of the silicon solar cell causes thermal generation of currents to occur near the surface of the solar cell. The metallic contact acts as a large sink for recombination and also as a large source for generation of electron-hole pairs.

SUMMARY OF THE INVENTION

It is therefore an object of this invention to improve the performance of the fine geometry solar cell by minimizing the reverse current from the front layer to the junction of the solar cell.

The foregoing and other objects of the invention are obtained by reducing the area of ohmic contact which causes the generation of hole-electron pairs at the surface of the solar cell. According to the invention, a fine geometry metallic grid can be created which shades perhaps 5% of the area but only contacts 0.2% of the area of the solar cell. According to prior techniques, a fine line metallic electrode contacts the upper surface of the solar cell, and the spaces not in contact with the electrode are covered by an anti-reflective coating. This structure may be achieved by initially forming the anti-reflective coating on the solar cell and then etching the fine line pattern into the anti-reflective coating. The metallic grid is then formed into the etched regions. In contrast to this technique, the subject invention differs in that the device is rotated approximately 90° following the step of etching a fine line pattern in the anti-reflective coating. The fine geometry metallic electrode is then deposited onto the surface of the solar cell, but due to the 90° rotation, only point contacts are made between the fine geometry metallic electrode and the exposed surface of the solar cell.

BRIEF DESCRIPTION OF THE DRAWINGS

The specific nature of the invention, as well as other objects, aspects, uses and advantages thereof, will clearly appear from the following description and from the accompanying drawing, in which.

DESCRIPTION OF THE PREFERRED EMBODIMENT

Figure 1:
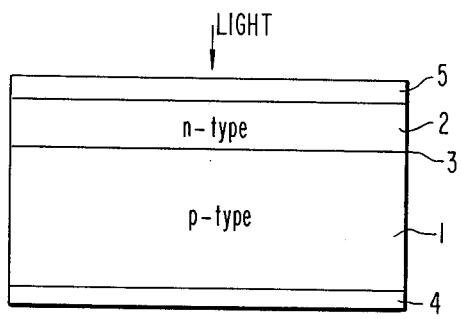
FIG. 1 is a general block diagram of a side view of a solar cell having metallic fingers located on the top surface.

Referring to FIG. 1, there is shown a side view of a typical solar cell. There will be described a single crystal, n-p silicon solar cell although the invention has applicability to all types of single crystal solar cells, including, for example, GaAs solar cells. The term "single crystal" is well known in the art and refers to lattices having absolute perfect crystallographic order, but as described herein, also includes nearly single crystal cells which are almost perfectly crystallographic. In addition, the inventive concepts described herein are not limited to single crystal solar cells of the type illustrated but may also be applied to thin film solar cells.

Figure 2:
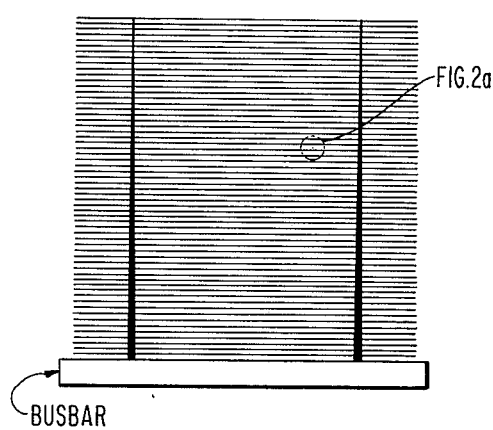
FIG. 2 is a diagram of the fine geometry metallic contact used on the top surface of the solar cell of FIG. 1.

The single crystal silicon solar cell comprises a silicon substrate 1 of p-type material and a silicon layer 2 of n-type material with an n-p junction 3 positioned a predetermined depth below the top surface of silicon layer 2. In an n-p silicon solar cell, the junction 3 will produce an electric field directed towards the substrate 1 thereby resulting in generated electrons flowing to the top of surface 2 with holes flowing to the bottom of the substrate 1 wherein the holes may be collected by a contact 4 covering the entire bottom surface of layer 1. A fine geometry metallic grid as illustrated in FIG. 2 is used for a collection of electrons flowing to the light-incident surface of silicon layer 2. A suitable anti-reflective coating 5 is provided over the light-incident surface of silicon layer 2. This anti-reflective coating 5 has a thickness of one-quarter wavelength of the desired portion of the spectrum of the light to which the solar cell is to be exposed, and the coating further has the required transparency and index of refraction. For the blue-violet portion of the spectrum corresponding to 0.3–0.5 microns, tantalum oxide has been found to be a suitable anti-reflective coating.

Figure 3:
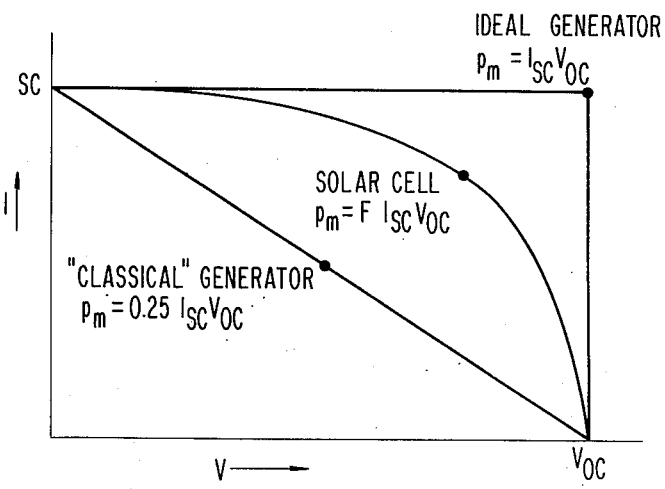
FIG. 3 is a generalized graph showing the current-voltage relation for different generators.

According to the Lindmayer patent, the n-p junction 3 is located at a relatively shallow depth of between 500 A to 2,000 A below the light-incident surface of the silicon layer 2. An advantage of this extremely shallow junction depth is that there is little or no crystal lattice damage with the result that the diodes become much more ideal. In the sample junction theory or so-called "diffusion theory", the following relation applies:

$$I = I_0 (e^{qV/kT} - 1),$$

where $I$ is the diode current, $I_0$ is the reverse diode current, $V$ is the applied voltage, and $kT/q$ is the thermal voltage. Actual solar cells do not follow this relationship, but rather the following:

$$I = I_0 (e^{qV/nkT}) - 1),$$

wherein $n$ is a quantity greater than unity. In conventional solar cells, $n$ is $\cong 2$, while, of course, in the ideal case, $n = 1$. This fact "softens" the I - V characteristics of solar cells. This is illustrated in FIG. 3. The electric power available from solar cells may be written as follows:

$$P_m = I_{sc}V_{oc}F,$$

where $I_{sc}$ is the short-circuit current, $V_{oc}$ is the open-circuit voltage, and $F$ is the "fill factor". FIG. 3 shows the characteristics of different generators. The "classical" generator with an ohmic internal resistance is shown as a straight line with $F = 0.25$; the "ideal" generator is represented by a rectangle with $F = 1$. Practical solar cells lie between these two extreme cases. The improved solar cell according to the Lindmayer patent achieved an $n$ value of about 1.1 and $F$ approaching 0.80. This represented a rather dramatic improvement over prior art conventional solar cells which typically showed an $F$ of about 0.72. The present invention represents an improvement in these almost ideal figures.

According to the Lindmayer patent, a solar cell cannot be improved simply by narrowing the junction depth. One factor which competes with the shallow junction is series resistance. As the series resistance increases, as a rule the efficiency drops. The greatest contributor to the series resistance is the lateral resistance of the upper layer. The narrower it is made, the greater the series resistance. The relatively high lateral resistance is offset by the novel electrode pattern disclosed in the Lindmayer patent which results in a metallic contact separation of only approximately 0.03 cm. Thus, the combination of a junction depth between 500 A to 2,000 A and the metallic finger separation on the order of 0.03 cm permitted the fabrication of a solar cell that had about 40% better efficiency than anything known before it. However, while the shallow junction results in a minimization of the dead layer which exists at the light-incident surface of earlier solar cells, the density of impurities diffused into the top layer of the solar cell is increased thereby providing sources for a significant reverse current flow. The ohmic contact formed between the metallic fingers and the top surface layer 2 causes thermal generation of currents to occur near the surface of the solar cell. The metallic contact acts as a large sink for recombination and also a large source for generation of electron-hole pairs. The applicants have discovered that the reverse current from the front layer to the junction of the solar cell may be minimized by reducing the area of ohmic contact which causes the generation of hole-electron pairs at the surface of the solar cell. Structurally, the invention comprises a reduction in the contact area of the fine geometry metallic grid with the solar cell by interposing an insulating coating. The surface density of the insulator is adjustable and therefore can minimize the amount of thermal generation current. This may be accomplished by manufacturing the solar cell according to the following process:

1. After the junction is formed, a metal-oxide anti-reflective coating is deposited on the surface of the solar cell. This metal-oxide coating should have the proper optical properties and a minimum of surface state densities. These oxides may be tantalum oxide, niobium oxide or, in general, oxides of Group VB metals and may include a thin layer of natural $S_iO_2$. Since the metal oxide is an insulator, openings in the coating are provided to expose the top surface of the solar cell. For example, using photolithography, one can create openings in such an oxide coating in the form of parallel lines. Each one of these lines may be three to four microns wide and 100 such lines may be placed on 2×2 cm$^2$ solar cell. These openings represent less than 2% of the total area, and the associated losses fall well below 1% after the solar cell is covered with a cover slide.

2. In a second photoresist step, a fine geometry metallic grid is deposited such that the fingers of the metallic grid are transverse to the line openings in the metal oxide coating. The result is a matrix of line openings in one direction and metallic conductors in a perpendicular direction. An ohmic contact between the conductors and the exposed surface of the solar cell is formed only at the crosspoints of the matrix. If there are 60 fine lines in the second mask, approximately 6,000 small point contacts will be formed between the metal and the top layer of the solar cell. Since the anti-reflective metal oxide coating acts as an insulator; it prevents the formation of an ohmic contact in those areas which are not exposed. The metal/semi-conductor contact area which results using this technique is less than 0.1% of the total area of the light-incident surface of the solar cell. This minimization of the contact area results in a minimization of the reverse current from the front layer and has a distinct effect on the fill factor.

Figure 2A:
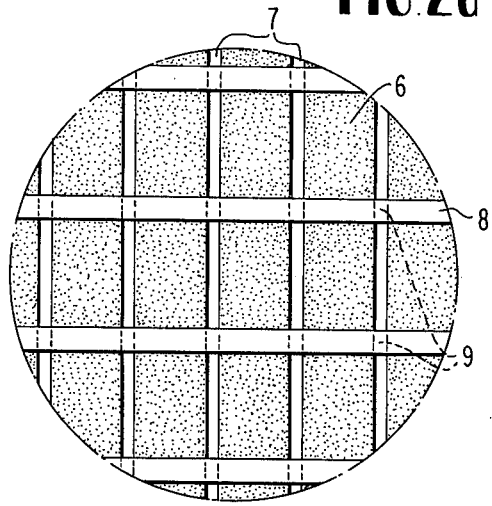
FIG. 2a is a greatly magnified view of a portion of the fine geometry metallic contact shown in FIG. 2 illustrating the dotted contact feature of the invention.

The structure that results from the process just described is illustrated in FIG. 2a. As shown in that Figure, the anti-reflection coating 6 is etched to provide a series of parallel fine line openings 7. Metallization fingers 8 are then deposited transverse to these openings 7 to produce a plurality of point contact areas 9. These point contact areas 9 are the only ohmic contacts on the light-incident surface of the top layer of the solar cell.

It will be apparent that the embodiment is only exemplary and various modifications can be made in construction and arrangement within the scope of the invention as defined in the appended claims.

What is claimed is:

1. A solar cell comprising a semi-conductor material having top and bottom surfaces and having a p-n junction at a distance of between 500 A and 2,000 A from the top semi-conductor surface thereof, said top surface having a metal oxide anti-reflective coating and being adapted to receive incident light radiation, said metal oxide coating having a fine line pattern etched therein to expose said top surface, an electrode on said bottom semi-conductor surface, and a patterned electrode deposited over said etched metal oxide coating such that the patterned electrode is generally transverse to said fine line pattern to produce a plurality of point contact areas between said patterned electrode and said top semi-conductor surface.

2. A solar cell is recited in claim 1 wherein said etched fine line pattern in said metal oxide coating is in the form of parallel line openings three to four microns wide.

3. A solar cell as recited in claim 2 wherein said patterned electrode comprises a plurality of parallel, thin metallic fingers electrically connected together, said thin metallic fingers being separated by distances on the order of $n \times 10^{-2}$ cm., where $n$ is a whole number between 1 and 9.

4. A solar cell as recited in claim 3 wherein said thin metallic fingers are separated by distances of approximately 0.03 cm.

5. A solar cell as recited in claim 3 wherein said metal oxide coating is tantalum oxide and has a thickness of one-fourth $\lambda$ in the blue-violet region of the spectrum.

6. A solar cell as recited in claim 3 wherein said metal oxide coating is niobium oxide and has a thickness of one-fourth $\lambda$ in the blue-violet region of the spectrum.

7. A solar cell as recited in claim 3 wherein said semi-conductor material is silicon.

8. A solar cell as recited in claim 7 wherein said p-n junction divides said semi-conductor material into a top $n$ type layer and a bottom $p$ type layer.

9. A solar cell as recited in claim 3 wherein said line openings are distributed substantially evenly over said metal oxide coating at a density in one dimension of approximately fifty openings per centimeter.

10. A solar cell as recited in claim 9 wherein said metallic fingers are spread substantially evenly over said metal oxide coating at a density in one dimension of approximately thirty metallic fingers per centimeter.

* * * * *